(12) United States Patent
Lee et al.

(10) Patent No.: US 11,916,163 B2
(45) Date of Patent: Feb. 27, 2024

(54) SYSTEM AND METHOD FOR THE REPAIR OF SERIALLY CONNECTED DISPLAY ELEMENTS

(71) Applicant: eLux Inc., Vancouver, WA (US)

(72) Inventors: Jong-Jan Lee, Camas, WA (US); Paul J. Schuele, Washougal, WA (US)

(73) Assignee: eLux, Inc., Vancouver, WA (US)

( * ) Notice: Subject to any disclaimer, the term of this patent is extended or adjusted under 35 U.S.C. 154(b) by 315 days.

(21) Appl. No.: 17/464,892

(22) Filed: Sep. 2, 2021

(65) Prior Publication Data
US 2021/0399165 A1   Dec. 23, 2021

Related U.S. Application Data

(60) Division of application No. 16/727,186, filed on Dec. 26, 2019, which is a continuation-in-part of
(Continued)

(51) Int. Cl.
*H01L 33/00* (2010.01)
*H01L 33/24* (2010.01)
*H01L 33/38* (2010.01)

(52) U.S. Cl.
CPC ...... *H01L 33/0093* (2020.05); *H01L 33/0095* (2013.01); *H01L 33/24* (2013.01); *H01L 33/38* (2013.01)

(58) Field of Classification Search
CPC . H01L 33/0093; H01L 33/0095; H01L 33/24; H01L 33/38; H01L 33/20; H01L 33/62; H01L 25/0753
See application file for complete search history.

(56) References Cited

U.S. PATENT DOCUMENTS 9,553,069 B2   1/2017  Han et al.
2017/0358505 A1*  12/2017  Chang ............... H01L 33/62
(Continued)

OTHER PUBLICATIONS

G. Cummins and M. P. Y. Desmulliez Inkjet printing of conductive materials: a review, Circuit World, 2012, 38, 193-213.~.
(Continued)

*Primary Examiner* — Jonathan Han
(74) *Attorney, Agent, or Firm* — Law Office of Gerald Maliszewski; Gerald Maliszewski

(57) ABSTRACT

A system and method are provided for repairing an emissive element display. If a defective emissive element is detected in a subpixel, a subpixel repair interface isolates the defective emissive element. The repair interface may be a parallel repair interface with n number of selectively fusible electrically conductive repair nodes, connected in parallel to a control line of the matrix. Alternatively, the repair interface may be a series repair interface with m number of repair nodes, selectively connectable to bypass adjacent (defective) series-connected emissive elements. If the subpixel emissive elements are connected in parallel, and a defective low impedance emissive element is detected, a parallel repair interface fuses open a connection between the defective emissive element and a matrix control line. If the subpixels include series-connected emissive elements, and a high impedance emissive element is detected, a series repair interface forms a connection bypassing the defective emissive element.

21 Claims, 12 Drawing Sheets

Related U.S. Application Data application No. 16/406,196, filed on May 8, 2019, now Pat. No. 10,643,981, which is a continuation-in-part of application No. 16/406,080, filed on May 8, 2019, now Pat. No. 10,804,426, which is a continuation-in-part of application No. 16/125,671, filed on Sep. 8, 2018, now Pat. No. 10,516,084, which is a continuation-in-part of application No. 15/838,536, filed on Dec. 12, 2017, now Pat. No. 10,242,977, which is a continuation-in-part of application No. 15/722,037, filed on Oct. 2, 2017, now Pat. No. 10,543,486, which is a continuation-in-part of application No. 15/691,976, filed on Aug. 31, 2017, now Pat. No. 10,535,640, which is a continuation-in-part of application No. 15/440,735, filed on Feb. 23, 2017, now Pat. No. 10,381,335, which is a continuation-in-part of application No. 15/416,882, filed on Jan. 26, 2017, now Pat. No. 10,446,728, which is a continuation-in-part of application No. 15/413,053, filed on Jan. 23, 2017, now Pat. No. 10,520,769, which is a continuation-in-part of application No. 15/412,731, filed on Jan. 23, 2017, now Pat. No. 10,418,527, which is a continuation-in-part of application No. 15/410,195, filed on Jan. 19, 2017, now Pat. No. 10,236,279, which is a continuation-in-part of application No. 15/410,001, filed on Jan. 19, 2017, now Pat. No. 9,825,202, which is a continuation-in-part of application No. 14/749,569, filed on Jun. 24, 2015, now Pat. No. 9,722,145, and a continuation-in-part of application No. 15/221,571, filed on Jul. 27, 2016, now Pat. No. 9,755,110, and a continuation-in-part of application No. 15/197,266, filed on Jun. 29, 2016, now Pat. No. 10,249,599, and a continuation-in-part of application No. 15/190,813, filed on Jun. 23, 2016, now Pat. No. 9,892,944, and a continuation-in-part of application No. 15/158,556, filed on May 18, 2016, now Pat. No. 9,985,190, and a continuation-in-part of application No. 15/266,796, filed on Sep. 15, 2016, now Pat. No. 9,917,226, and a continuation-in-part of application No. 14/680,618, filed on Apr. 7, 2015, now Pat. No. 10,115,862, which is a continuation-in-part of application No. 14/530,230, filed on Oct. 31, 2014, now abandoned.

(56) References Cited

U.S. PATENT DOCUMENTS

2019/0198483 A1* 6/2019 Wang .................. H01L 33/54
2020/0135090 A1* 4/2020 Lee .................. G09G 3/3225

OTHER PUBLICATIONS

Cano-Raya, C.; Denchev, Z.Z.; Cruz, S.F.; Viana, J.C. Chemistry of solid metal-based inks and pastes for printed electronics—A review. Appl. Mater. Today 2019, 15, 416-430.

* cited by examiner

METAL 1

SYSTEM AND METHOD FOR THE REPAIR OF SERIALLY CONNECTED DISPLAY ELEMENTS

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to display technology and, more particularly, to inorganic micro-light emitting diode (µLED) displays designed with redundancy and repair features.

2. Description of the Related Art

A color display is composed of three subpixels that emit light at three wavelengths corresponding to the visible colors red, green, and blue, which is referred to as an RGB display. The RGB components of the pixel are turned on and off in a systematic way to additively produce the colors of the visible spectrum. There are several display types that produce the RGB images in different ways. Liquid crystal displays (LCDs) are the most prevalent technology and they produce RGB images by shining a white light source, typically a phosphor produced white LED, through a color filter of a subpixel. Some portion of the white light wavelengths is absorbed and some transmitted through the color filter. Organic light emitting diode (OLED) displays produce RGB light by direct emission of each of those wavelengths of light at a pixel level within the organic light emitting material. Another display technology is the microLED display, which uses micro-sized inorganic LEDs for the direct emission of light at the pixel level.

For LCD, OLED, and microLED displays, an array of light control valves (for LCD) or emitting elements (for OLED and microLED) are arranged in an ordered array. For a high definition (HD) display the array consists of 1920× 1080 pixels and for ultra-high definition (UHD) 4K displays and 8K displays, the array size increases to 3840×2160 and 7680×4320 pixels, respectively. There are two kinds of control circuits used for displays, an active matrix (AM) circuit has one or more control transistor(s) for each subpixel, while each individual sub-pixel is driven by an external driver IC in a passive matrix (PM) circuit. For HD, UHD, and 8K displays, because of the large number of pixels in one display, a passive matrix array would need a huge number of driver ICs. Therefore, for typical HD, UHD, and 8K displays, active matrix pixels are usually applied. Conversely, LCD backlight units (BLU) using microLEDs, which may have a few hundred to 10,000 local dimming zones, may reasonably use passive matrix driving to limit complexity and cost.

FIG. 1 is a schematic diagram of a typical subpixel driving circuit for an LCD display (prior art). When scanning the array, the switching transistor (Sw-Tr) turns on, and data is written by setting the voltage on the storage capacitor ($C_{st}$). The storage capacitor ($C_{st}$) holds the liquid crystal ($C_{LC}$) biased at the written data (voltage), which in turn determines the amount of light transmitted by the sub-pixel. The switching transistor only consumes power during writing. Assuming that the leakage current of the storage capacitor and the liquid crystal cell are negligible, the pixel circuit does not consume power other than during the switching (data writing) period. For the LCD display the primary mode of power consumption is the backlight unit (BLU), which produces the white light that is controlled by the LCD cell.

FIGS. 2A and 2B respectively depict a typical LED pixel and associated current/voltage (IV) characteristics of the drive circuit and LED (prior art). Unlike LCD displays, OLED and microLED displays are self-emitting devices and constant current is supplied to the LED to create the emission of light. The image data is supplied as a voltage via a data line, which is applied to the gate of the driving transistor (Dr-Tr) through the switching transistor (Sw-Tr). The data voltage ($V_{st}$) is stored in the storage capacitor ($C_{st}$), which holds the gate-to-source voltage ($V_{gs}$) of Dr-Tr at a constant value, which in turn controls the conductance of Dr-Tr and thus the current through the LED.

The supply voltage $V_{DD}$ drops across the transistor and diode connected in series, and the percentage which drops across each device depends on their respective IV characteristics. LED1 and LED2 may have different IV characteristics as shown in FIG. 2B, where LED1 has a lower turn on voltage. So the voltage across LED1($V_{S1}$) is lower than that of LED2 ($V_{S2}$) for the pixel circuit FIG. 2A. The power consumption of the transistor and LED at the light-on condition is $I_D \times (V_{DD} - V_S)$ and $I_{LED} \times V_S$, respectively, where $I_D$ and $I_{LED}$ are equal. In contrast to the pixel circuit for LCD display, the active matrix (AM) OLED or microLED pixel circuits continue to consume power after the switching transistor is turned off. The power is used to produce light from the LED, but the drive transistor also dissipates a significant portion of total power.

Large area displays are typically fabricated on glass or plastic substrates with the pixel control circuits made using a thin-film transistor (TFT) technology such as low-temperature polysilicon (LTPS) or indium-gallium-zinc-oxide (IGZO). The TFT transistors are fabricated at temperatures below the melting temperature of the substrate and using large area lithography tools, which imposes several restrictions on the size and performance of the transistors. CMOS transistors fabricated in silicon have a field effect mobility of over 600 square centimeters per volt second ($cm^2/(V \cdot s)$), while LTPS mobility may be 80-100, and IGZO mobility is typically between 10 and 20. TFT transistors have relatively high variability in doping activation so the operating point is chosen with a threshold voltage of 1 to 5 V to prevent excessive off current. These practical limitations of the TFT technology force display circuits to use relatively high operating voltages of 10 V and greater, while also dissipating significant power in the TFT because low mobility increases the on state resistance.

For a typical AM OLED device on glass, $V_{DD}$ is greater than 10V and the turn on voltage for the OLED is around 5 V. In this configuration ($V_{DD}$=10 V, OLED turns on at 5 V), about 50% of power is dissipated by the drive transistor and the other 50% powers the OLED to generate light. For the same pixel circuit, replacing the OLED with a microLED, more power (~70%) is dissipated by the transistor because the microLED has a lower turn on voltage at around 3 V. One way to balance the power consumption of the drive transistor and microLED is to reduce $V_{DD}$. However, this option is limited for TFT circuits because lower voltage driving requires decreasing the TFT threshold voltage, which can cause unacceptable high variability in leakage current.

It would be advantageous if a pixel circuit could be used to reduce the drive transistor power consumption for microLED AM display panels while keeping the same TFT structure and circuit used for OLED displays.

It would be advantageous if LED pixel circuitry existed that permitted repairs to overcome the common defects which cause non-working pixels. To that end, it would be advantageous if a pixel included redundant LEDs in parallel to compensate for missing or non-connected LEDs, and optionally disconnect shorted LEDs. Alternatively, it would be advantageous if a pixel repair structure could shunt current around defect (open circuit) sites.

SUMMARY OF THE INVENTION

Disclosed herein are light emitting diode (LED) pixel drive circuits that can be used to repair some common defects that result in non-working pixels. One circuit uses redundant LEDs in parallel to compensate for missing or non-connected LEDs, effectively increasing assembly yield. A second circuit connects LEDs in series to increase the pixel operating voltage, so less power is dissipated in the TFT circuit, which increases the display efficiency. For the series connection, a missing or unconnected LED causes the circuit to fail, so a repair structure is used to shunt current around a defect site. For LEDs connected in parallel, a shorted LED drops the supply voltage to ground, preventing illumination of the other functional LEDs. So the repair structure is a laser fuse to disconnect the defect site.

Accordingly, a method is provided for repairing an emissive element display. The method provides a substrate with a matrix of emissive element (column and row) control lines. The method forms an array of emissive element subpixels, with repair interfaces, electrically connected to the matrix of control lines. For example, a subpixel may be responsible for generating the blue light in a red/green/blue (RGB) pixel. The method populates the subpixels with emissive elements. If a defective emissive element is detected in a subpixel, the method enables a subpixel repair interface to isolate the defective emissive element. The repair interface may be a parallel repair interface with n number of selectively fusible electrically conductive repair nodes, connected in parallel to a control line of the matrix. Alternatively, the repair interface may be a series repair interface with m number of repair nodes, selectively connectable to bypass adjacent (defective) series-connected emissive elements.

In one aspect, prior to populating the subpixels with emissive elements, the method forms a dielectric layer overlying a top surface of the substrate. Wells are formed in the dielectric layer, with each well configured to accept an emissive element. Access openings are formed in the dielectric layer to expose each repair interface if a repair is subsequently required. In some other aspects, the repair nodes are formed on the dielectric layer top surface.

For example, in one aspect subpixels are populated with n emissive elements electrically connected in parallel between a first control line and a second control line of the matrix, and a low impedance defective emissive element or short circuiting element is detected in one of the subpixels. Then, a parallel repair interface fuses to open an electrical connection between the defective emissive element and a matrix control line.

In another example, forming the array of emissive element subpixels includes configuring subpixels for the series connection of m emissive elements between a first control line and a second control line of the matrix. If a high impedance defective (i.e., broken or missing) emissive element is detected in a subpixel, a series repair interface forms an electrical connection bypassing the defective emissive element.

Additional details of the above-described method as well as an emissive element display with repair interfaces are provided below.

DETAILED DESCRIPTION

The general process for making a micro-light emitting diode (μLED or microLED) display using inorganic LEDs and fluidic assembly on a display backplane has been reported in the parent applications U.S. Pat. Nos. 9,825,202 and 10,418,527, which are incorporated herein by reference. In particular, the process flow for making a suitable display backplane is described in U.S. Pat. No. 9,825,202 in the explanation of FIG. 17, and the geometric requirements for fluidic assembly are presented in the explanation of FIG. 16. Although the emissive elements described herein are typically LEDs, alternatively they may be any electrical component capable of emitting light.

Figure 3:
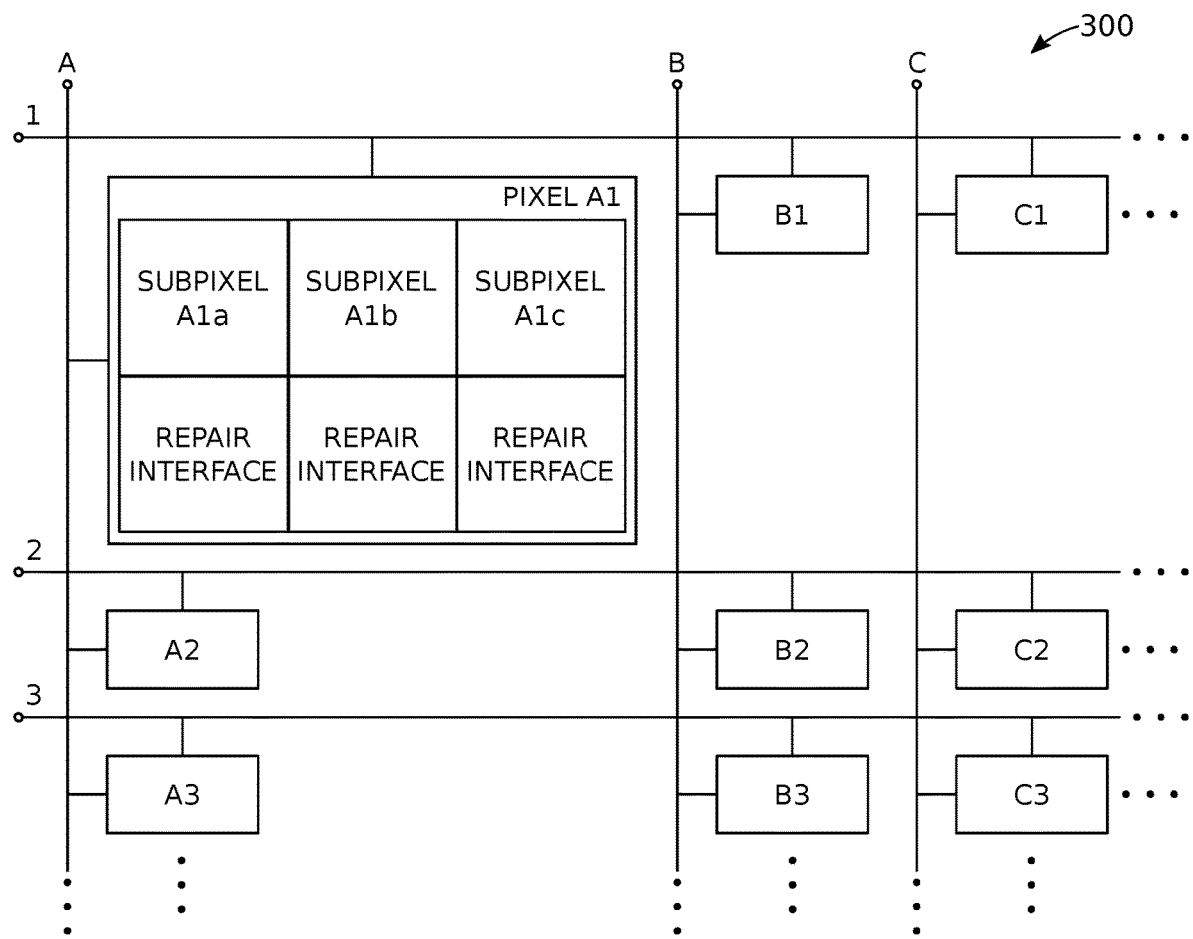
FIG. 3 is a schematic block diagram depicting a display with emissive element repair interfaces.

FIG. 3 is a schematic block diagram depicting a display with emissive element repair interfaces. The display 300 comprises a substrate with a top surface (shown in subsequent figures) and a matrix of electrically conductive control (column and row) lines. For simplicity, only row lines 1, 2, and 3 are shown with column lines A, B, and C. The display may typically comprise millions of pixels, as described above in the Background Section. Therefore, pixels A1 through C3 are shown, where the pixels are identified by their intersecting matrix control lines. Each pixel comprises a plurality of subpixels. Representative of all the pixels, pixel A1 includes subpixels A1a, A1b, and A1c, such as might correspond to the emitted wavelength colors of red, green, and blue (RGB). However, the display is not limited to any particular number of subpixels per pixel. For example, pixels with the subpixel colors of red, green, blue, and yellow are known. Each subpixel is configured to accept a plurality of emissive elements, as described in more detail below. As used herein, the terms "pixel" and "subpixel" may refer to the regions of the display and connecting circuitry configured to accept emissive elements. That is, a pixel or subpixel may refer to the region of a display either before or after it is populated by emissive elements.

A selectively isolating repair interface is associated with each subpixel, electrically connected to a corresponding control line of the matrix, as shown in more detail below. As shown in FIG. 3, repair interface A1a1 is associated with subpixel A1a, repair interface A1b1 is associated with subpixel A1b, and repair interface A1c1 is associated with subpixel A1c.

Figure 4D:
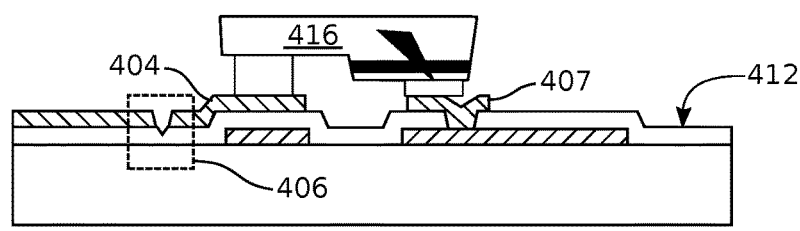
FIG. 4A is a plan top view and FIGS. 4B through 4D are partial cross-sectional views of a parallel repair interface with n number of selectively fusible electrically conductive repair nodes, connected in parallel to a control line (row) of the matrix.
Figure 4A:
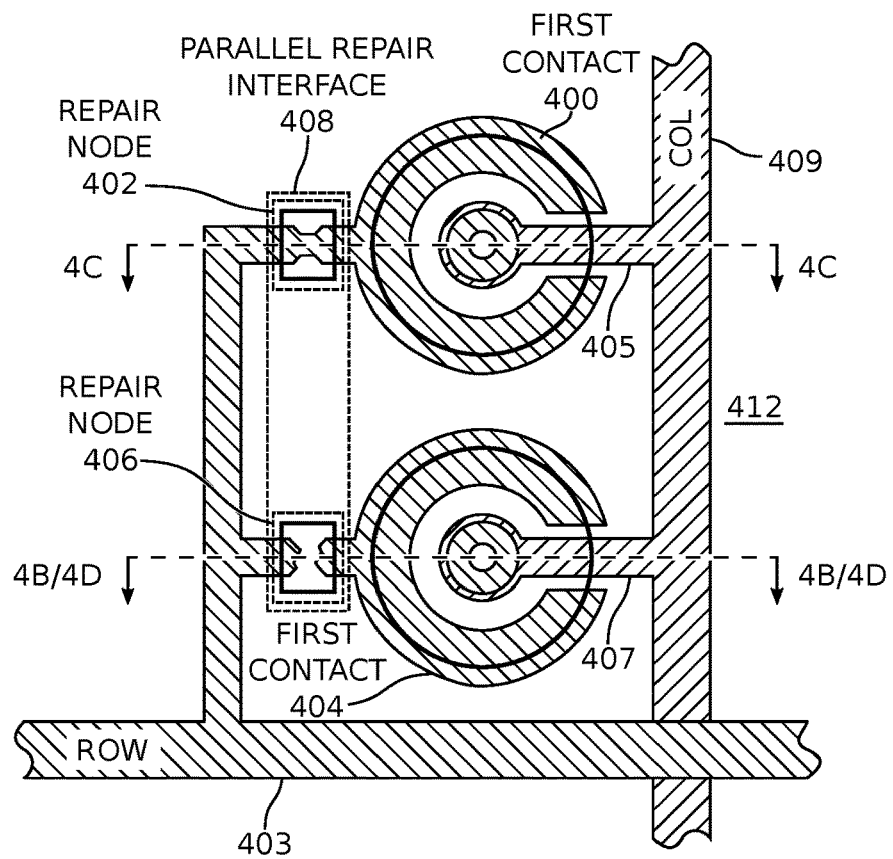
Figure 4B:
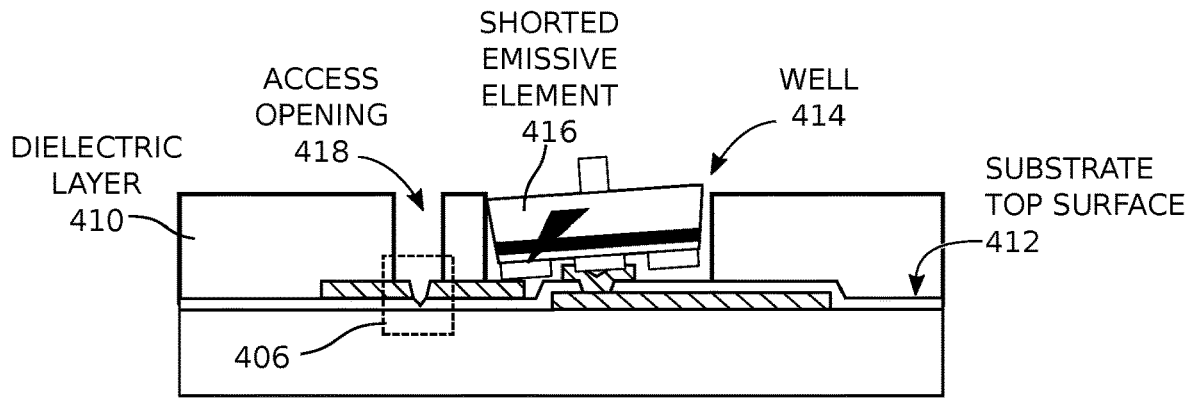
Figure 4C:
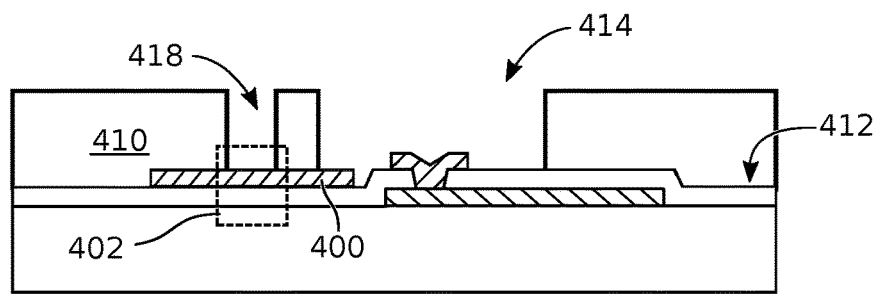

FIG. 4A is a plan top view and FIGS. 4B through 4D are partial cross-sectional views of a parallel repair interface with n number of selectively fusible electrically conductive repair nodes, connected in parallel to a control line (row) of the matrix. In this example, n is equal to 2, but n is not limited to any particular integer value (greater than 1). These examples are also directed to surface mount emissive elements, where the emissive elements have 2 electrodes, both mounted on their bottom surface (the surface facing downward towards the substrate top surface (see FIG. 12A). In this aspect, first contacts 400 and 404, and repair nodes 402 and 406 are formed on the substrate top surface. The repair nodes 402 and 406 are electrically connected to a corresponding first control line 403 (row) of the matrix. The subpixel further comprises n number of emissive element second contacts 405 and 407 formed on the substrate top surface, respectively associated with the emissive element first contacts 400 and 404, and electrically connected to a corresponding second control line 409 of the matrix.

As shown in FIGS. 4B and 4C, the display may further comprise a dielectric layer 410 overlying the substrate top surface 412. Wells 414 are formed in the dielectric layer 410, with each well formed to accept an emissive element 416. An access opening 418 in the dielectric layer 410 exposes repair nodes 402 and 406. Repair node 406 has been fused open due to a defective emissive element 416. Repair node 402 of FIG. 4C remains closed, connecting contact 400 with row 403 (see FIG. 4A). It is also possible to form the repair nodes on the top surface of the dielectric as described in some variations using vertical emissive elements, as described below.

FIG. 4D depicts a variation where surface mount emissive elements are assembled on the top surface 412 of the substrate without the aid of dielectric layer wells. As in FIG. 4B, repair node 406 is fused open due to a defective emissive element 416.

Figure 5A:
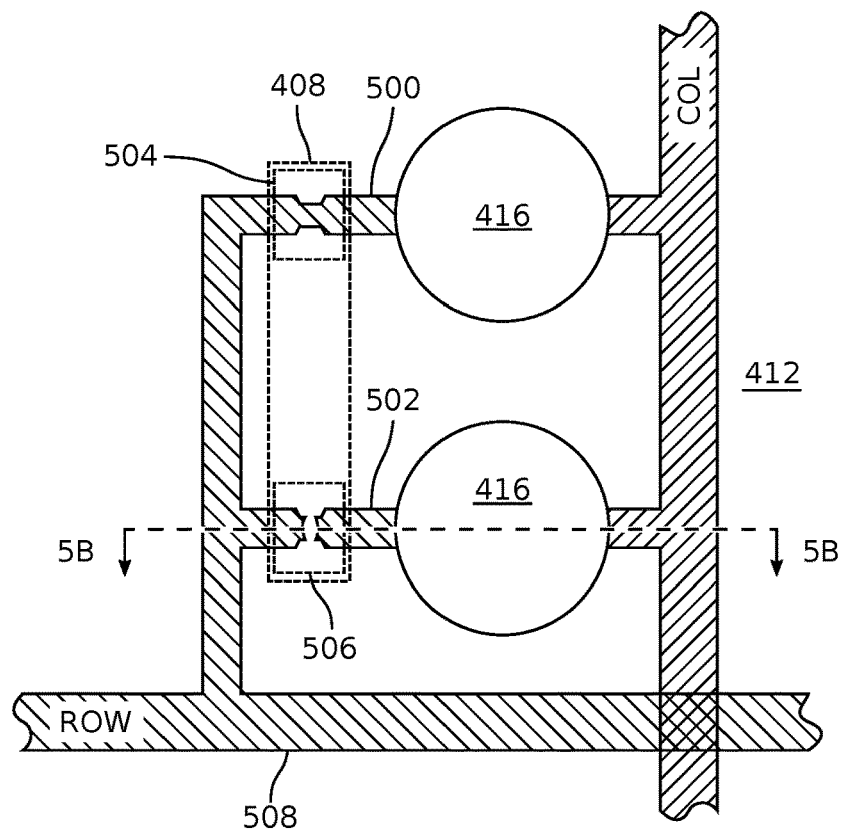
FIG. 5A is a plan top view and FIGS. 5B through 5D are partial cross-section views depicting the use of parallel repair interfaces with vertical emissive elements.
Figure 5B:
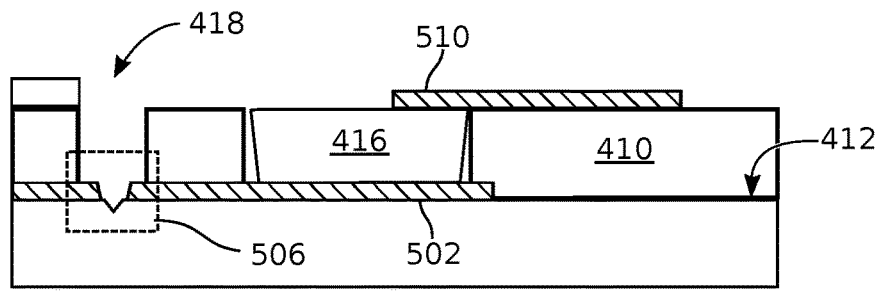
Figure 5C:
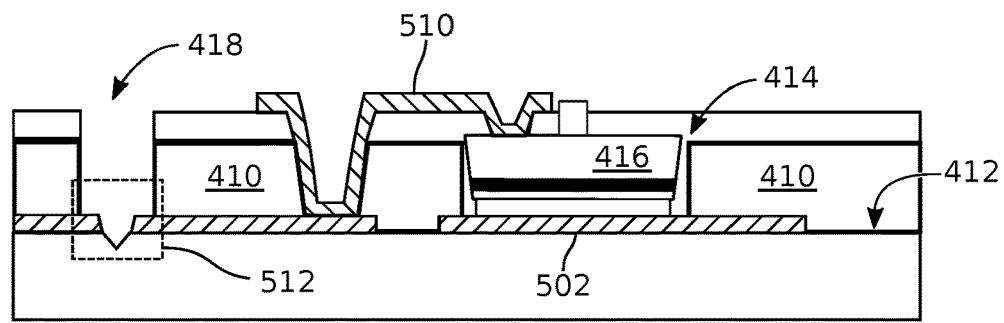
Figure 5D:
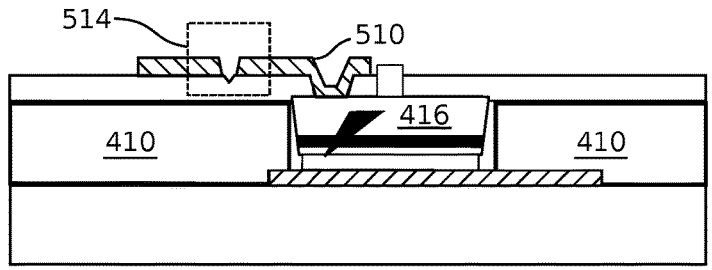

FIG. 5A is a plan top view and FIGS. 5B through 5D are partial cross-section views depicting the use of parallel repair interfaces with vertical emissive elements. A vertical emissive element has one electrode on its top surface and one electrode on its bottom surface (see FIG. 12B). As seen in FIG. 5A, n (e.g., 2) number of emissive element contacts 500 and 502 are electrically connected to corresponding repair nodes 504 and 506 of the parallel repair interface 408. As described below, the contacts from the column line to the top surfaces of the emissive elements are formed on a different layer of the display.

As seen in FIGS. 5B-5D, a dielectric layer 410 overlies substrate top surface 412, and wells 414 are formed in the dielectric layer to accept an emissive element. Emissive element contacts 500 and 502 are formed on the substrate top surface 412, and are connected to a first control line 508 of the matrix. A corresponding second emissive element contact 510 is formed on the top surface of the dielectric layer, and is connected to a corresponding control line of the matrix. The repair nodes may be electrically connected to either the first control line 502 of the matrix as shown in FIG. 5B, or the second control line 510, as shown in FIGS. 5C and 5D. Thus, the repair nodes may be formed on either the substrate top surface or the dielectric layer top surface.

FIG. 5B depicts an electrically open repair node 506 formed on the substrate top surface with access opening 418. FIG. 5C depicts an open repair node 512 formed on the substrate top surface, but connected to dielectric top surface contact 510. FIG. 5D depicts an open repair node 514 formed on the dielectric top surface and connected to top surface contact 510.

In any of the above-described parallel repair interface variations, if a low (lower than an average or predetermined value) impedance defective emissive element is detected, the repair node associated with the defective emissive element is fused electrically open to disconnect the defective emissive element from the matrix control lines. As used herein, a low impedance defective emissive element may also refer to a piece of material or emissive element creating an electrical short.

Figure 6A:
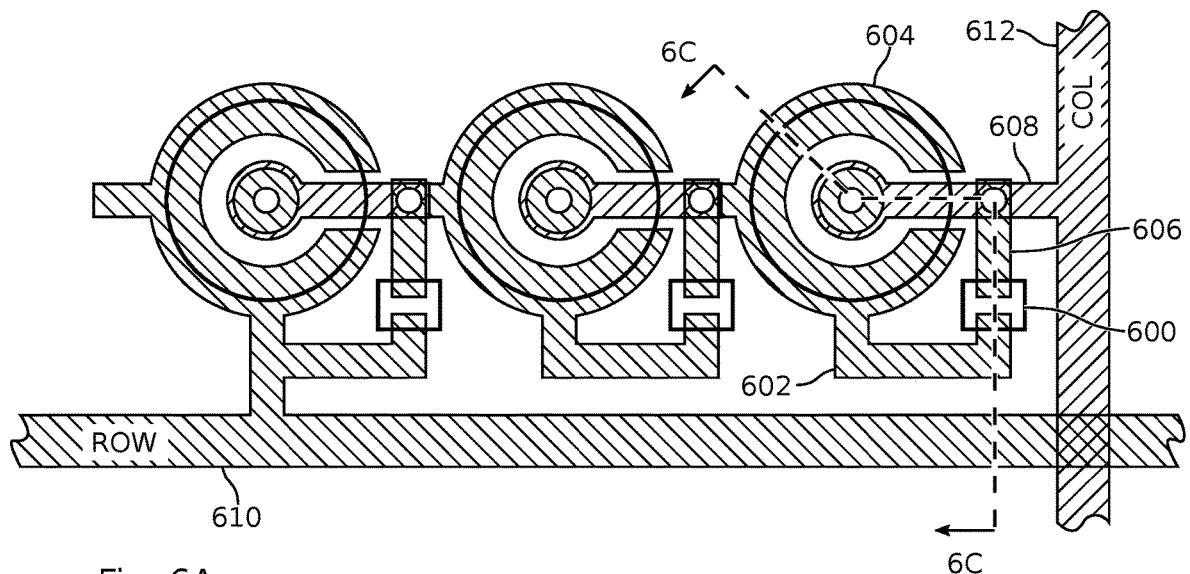
FIG. 6A is a plan top view and FIGS. 6B through 6E are partial cross-sectional views of series repair interfaces.

FIG. 6A is a plan top view and FIGS. 6B through 6E are partial cross-sectional views of series repair interfaces. In another aspect, the display comprises series repair interfaces with m number of repair nodes, selectively connectable to bypass adjacent series-connected emissive elements. In these examples m is equal to 3, but there is no explicit limitation to the value of m, as long as it is an integer value greater than 1. FIG. 6A depicts a subpixel configured to accept 3 series-connected emissive elements. In this configuration, there is a repair node associated with each emissive element. For example, repair node 600 has a first segment 602 electrically connected to a corresponding emissive element first contact 604, and a second segment 606 electrically connected to the emissive element second contact 608, where the first segment is selectively connectable to the second segment. The emissive element first contacts (e.g., contact 604) are operatively connected to a corresponding first control line 610 of the matrix. As used herein, the term "operatively connected" is defined as either directly electrically connected or indirectly electrically connected through an intervening element. The emissive element second contacts (e.g., contact 608) are operatively connected to a corresponding second control line 612 of the matrix. In the case of the variation of FIG. 6E it should be understood that repair nodes are formed on an overlying dielectric layer.

Figure 6B:
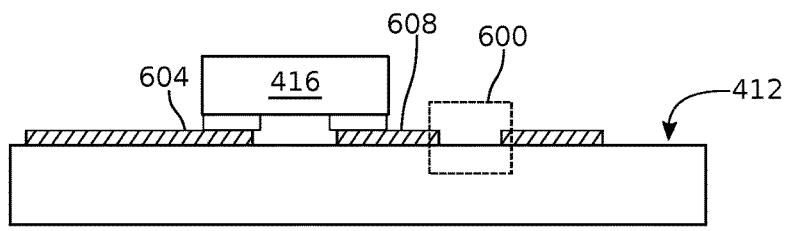

As explicitly shown in FIG. 6B, emissive element first and second contacts 604 and 608, and (open) repair node 600 are formed on the substrate top surface 412. In some aspects, such as in FIG. 6C, the display comprises a dielectric layer 410 overlying the substrate top surface 412. Wells 414 in the dielectric layer 410 are formed to accept an emissive element. The emissive element first and second contacts 604 and 608, and (open) repair node 600 are again formed on the substrate top surface 412. This variation also includes access opening 418 to expose repair node 600.

Figure 6C:
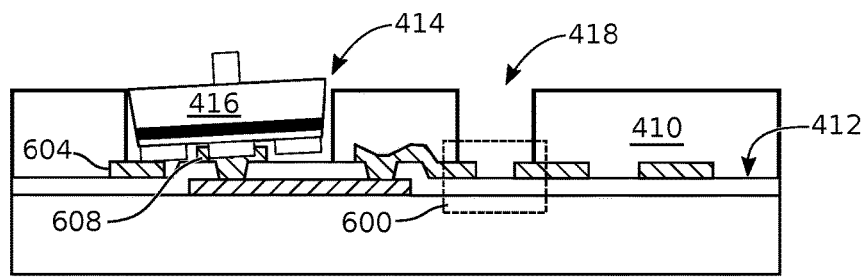
Figure 6D:
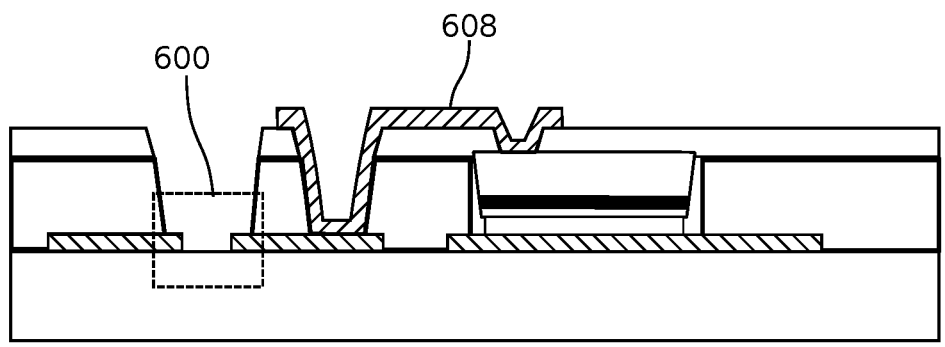
Figure 6E:
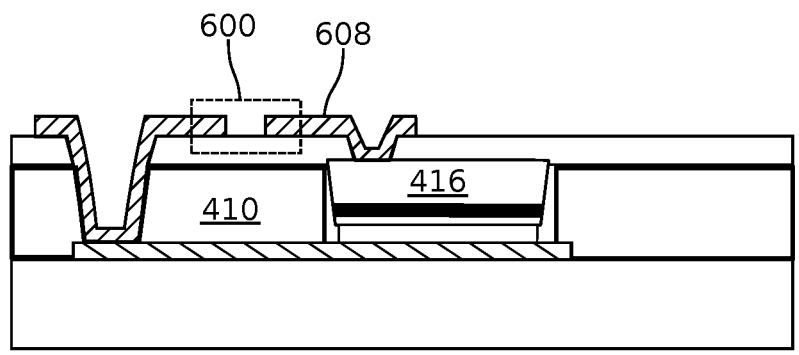

In FIGS. 6D and 6E, a vertical emissive element variation, the emissive element 416 has segment 608 on the top surface of the dielectric layer 410. In FIG. 6D (open) repair node 600 is formed on the substrate top surface 412. In FIG. 6E, (open) repair node 600 is formed on the top surface of the dielectric layer 410.

In any of the above-described series repair interfaces, if a defective emissive element is detected, where the defect is understood to be either a high (higher than average or a predetermined value) impedance emissive element or a missing emissive element, the first segment is electrically connected to the second segment to bypass the defective emissive element. A high impedance defective emissive element is defined herein as a non-functioning or missing emissive element.

One type of emissive element, the microLED is fabricated from metalorganic vapor-phase deposition (MOCVD) wafers like those used to make LEDs for general lighting (e.g., light bulbs), which makes the cost per device very low but also introduces some problems that are unique to the microLED technology. The structures used for fluidic assembly of microLEDs have been exhaustively described in patent application Ser. No. 16/406,080. For use in general lighting the most important characteristic of a device is low cost per generated photon, to minimize the cost of each light bulb. That constraint has caused LED fabrication practices to use a process called binning to deal with process variability and defects. Briefly stated, the binning process consists of testing each LED after packaging and placing each device in a comparable group with similar efficiency and emission wavelength characteristics while defective devices are discarded. The binning process allows the MOCVD fabrication to be cheaper because defect reduction and process control methods and costs are minimized. A recent characterization of 40 μm microLEDs fabricated from typical GaN based MOCVD wafers showed that 0.25% of the devices were shorted and 0.75% were open. For the subpixel design of FIG. 2A both of these defects cause a dark sub-pixel that is not acceptable for a display product.

Unfortunately, the binning technique is not practical for identifying and discarding defective microLEDs. The microLED is not packaged and the very small device and electrode sizes, make device handling and functional test difficult. Because a UHD requires at least 24.8 million microLEDs (3×3840×2160), the testing times would be astronomical. Consequently, new structures and methods are required to prevent defective microLEDs from killing subpixels. It is possible to remove a defective microLED and replace it, as has been described in parent U.S. Pat. No. 10,516,084 and Ser. Nos. 16/595,623 and 16/693,674, but the mechanical pick-and-place tools are expensive to buy and operate. It would be more desirable to have simple circuit methods to repair the most common subpixel defect types using techniques already developed for the display industry.

To fabricate a microLED display, microLED chips are fabricated on a sapphire substrate (GaN on sapphire, for blue and green emission) and/or on a GaAs substrate (AlGaAsP on GaAs, for red emission), which then must be transferred to a second substrate to make the display. The second substrate can be a Si wafer (or chip) with control circuitry built in, or it can be a substrate of glass or flexible plastic with thin film transistors. Several defect classes may produce an open circuit. The microLED may have missing electrodes or contacts that prevent connection to the substrate circuit. In the case of fluidic assembly, a site may be blocked by a particle or a broken microLED. In the case of mass transfer, a site may have no microLED because of a failed pickup to the transfer tooling or the microLED may be broken by the stamping action used to bond the microLED to the display.

Figure 7:
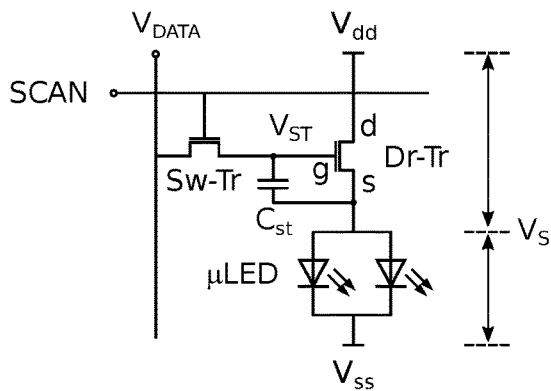
FIG. 7 is a schematic drawing of a parallel redundancy structure.

FIG. 7 is a schematic drawing of a parallel redundancy structure. Any final LED array is likely to include defects generated in the LED fabrication process and the display assembly process. In the example above with 0.25% of the sites shorted and 0.75% open, the subpixel yield is $1-P_S-P_O$ or 99%. To minimize or eliminate the defect repair step, redundancy structures are described herein to compensate for defects. One redundancy structure connects the two (or more) microLEDs in parallel as shown in FIG. 7. If one microLED is an open circuit or is missing, the other microLED receives 2× the current and is around 2× brighter. However, for this parallel connected arrangement any shorted microLEDs must be dealt with because current flowing through the short circuit site prevents other good sites from reaching turn on voltage. For the general case with redundancy, the subpixel yield is $(1-P_S)^N*(1-P_O^N)$, where N is the number of microLEDs connected in parallel. With N=2, the sample defectivity of the subpixel yield increases from 99 to 99.5%.

To repair a shorted site, a laser fuse structure is implemented to disconnect the defective site from the circuit, as shown for example in FIG. 4B. In this case the structure is made to capture a disk-shaped microLED positioned in the well opening using fluidic assembly methods as described in U.S. Pat. No. 10,516,084. There are two metal layers separated by an interlevel dielectric and a top dielectric layer may be a polymer material patterned to form trap structures to capture microLEDs. The column line is connected to $V_{DD}$ through a transistor (not shown) and the row line is connected to $V_{SS}$. Thus, the microLED is fabricated with the center electrode connected to the LED anode and the outer ring electrode connected to the cathode. Each leg of the parallel connection has a window (access opening) over one of the interconnect lines so a laser cut can be made in the underlying metal line to disconnect the shorted microLED. Laser fuses have been widely adopted in the semiconductor industry for repair of memory chips and for laser trimming of precision resistors, so the equipment need not be described here.

When the display is completed, a functional test applies power to all the subpixels and the position of each dark or weak site is noted. By measuring the current for each defective site, it can be determined if the failure is due to either a shorted or open microLED. In the case of the parallel connection failing by a short circuit, thermal or optical imaging can determine which of the microLEDs is defective and the appropriate laser fuse is cut. If the wrong fuse is cut it is also possible to repair the fuse using the conductive ink repair described below.

Figure 8A:
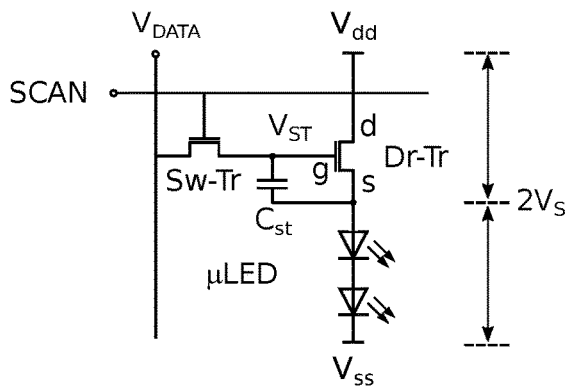
FIGS. 8A and 8B are, respectively, a schematic diagram and associated IV characteristics of an LED drive circuit using two series-connected LEDs.
Figure 8B:
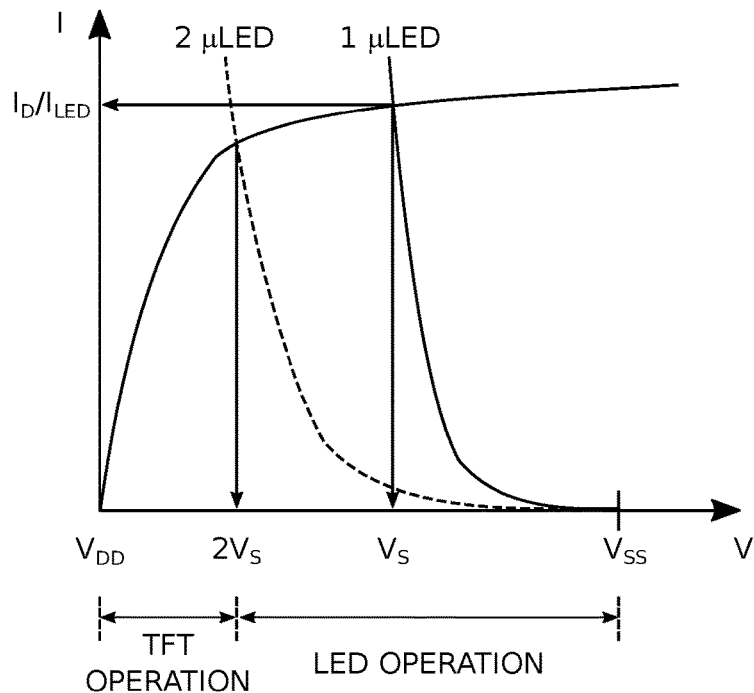

FIGS. 8A and 8B are, respectively, a schematic diagram and associated IV characteristics of an LED drive circuit using two series-connected LEDs. A simple solution to address the excessive power consumption in the drive transistor associated with the use of a single microLED is to redistribute the $V_{DD}$ drop by adding more microLEDs in a series connection, so that more voltage is dropped across the LEDs to produce emission. Referring to FIG. 8B the turn on voltage of the series-connected microLED is the sum of the turn on voltage for each device, which is about 6 V. In this case with $V_{DD}$ set to 10 V, the power consumption for the drive transistor and microLEDs are 40% and 60%, respectively. The microLED display with this arrangement uses 30% less power than the circuit with only one microLED per subpixel to produce the same luminance.

Figure 1:
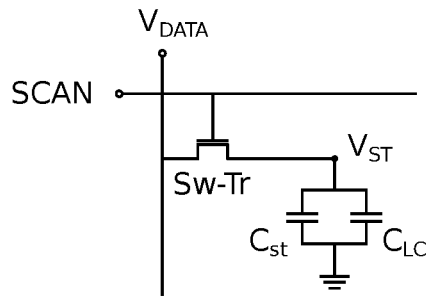
FIG. 1 is a schematic diagram of a typical subpixel driving circuit for an LCD display (prior art).
Figure 2A:
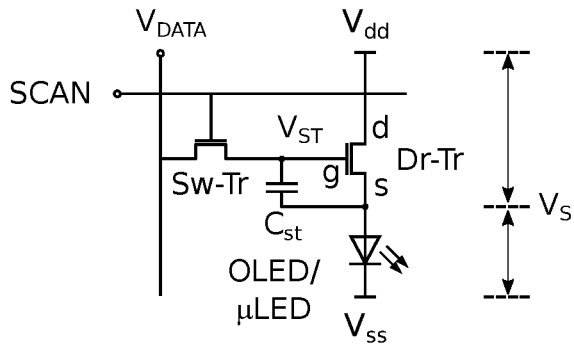
FIGS. 2A and 2B respectively depict a typical LED pixel drive circuit and associated current/voltage (IV) characteristics of the drive circuit and LED (prior art).
Figure 2B:
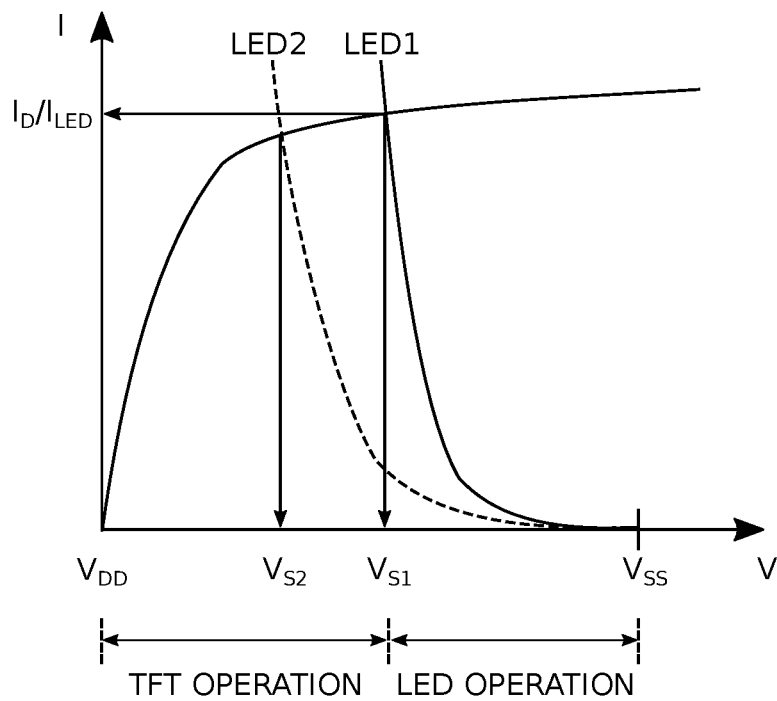

A shorted microLED does not affect subpixel yield because the circuit reverts to the single LED circuit of FIG. 2A. If one microLED site is shorted, the functional microLED receives a voltage drop of $V_S$, whereas the drive transistor has a voltage drop of $V_{DD}$-$V_S$. The power consumption of the drive transistor in a subpixel having only one working microLED increases, and the emission output is about 50% of the subpixel with two functional microLEDs at a given voltage. This emission variation in a repaired subpixel can be compensated for by the de-mura process when the display is completed. De-mura measures the luminance of the display and adjusts the drive current of each subpixel to produce the optimum brightness and color gamut.

Figure 9:
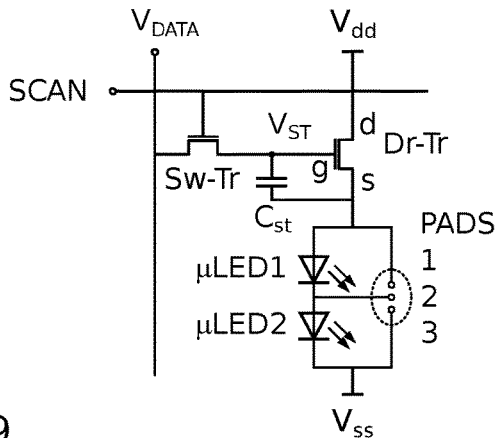
FIG. 9 is a schematic diagram depicting a repair structure for a subpixel using series-connected microLEDs.

FIG. 9 is a schematic diagram depicting a repair structure for a subpixel using series-connected microLEDs. In the defect case where one of the microLED sites is open, either due to an LED defect or a missing microLED, the other functional microLEDs in the series string do not work. For this kind of defect, the subpixel can be repaired by shorting the defective microLED site. FIG. 9 illustrates the circuit layout for the repair of an open circuit defect in a subpixel with two microLEDs connected in series. Three pads are built in the subpixel with openings that allow selective connection between two pads using a printed conductive ink. If microLED site 1 is open, pads 1 and pad 2 can be connected by depositing conducting material between them. The conductive ink can contain a variety of materials such as silver nanoparticles or nanowires, copper nanoparticles, graphene, graphite, or multi-wall carbon nanotubes in a carrier solvent. In practice, the two electrodes to be connected are positioned with a small gap inside a bank structure to contain the ink drop. This repair tool is common in the display industry and is not discussed in the interest of brevity. If microLED site 2 is open, then pads 2 and pad 3 are connected.

The series-connected subpixel can have two or more microLEDs depending on the LED turn on voltage and the voltage available from the driving circuit that sources $V_{DD}$. FIG. 6A shows a layout view of a series-connected circuit with three microLEDs and the appropriate repair structures for shunting around an open circuit. FIG. 6C is a cross-section view showing the arrangement of the row and column electrodes and a correctly assembled microLED in the well structure. In this case the column electrode is connected to $V_{DD}$ through the drive transistor (not shown) and the row electrode is connected to $V_{SS}$.

Figure 10A:
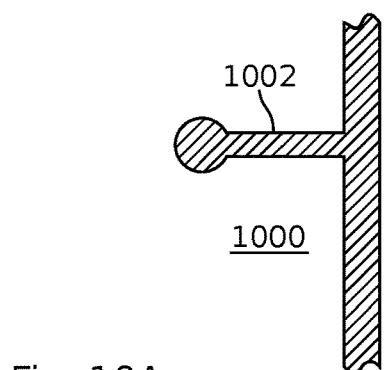
FIGS. 10A through 10D depict associated plan and partial cross-section view of steps in the fabrication of the subpixel of FIG. 6C.
Figure 10A:
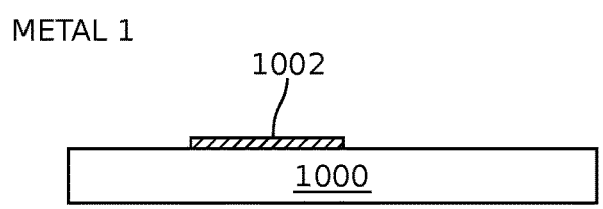
Figure 10B:
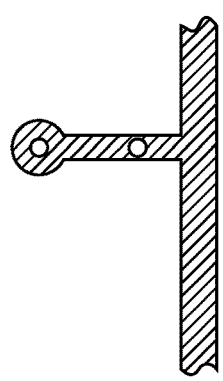
Figure 10B:
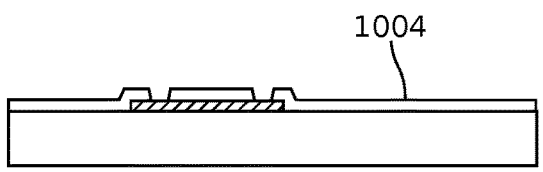
Figure 10C:
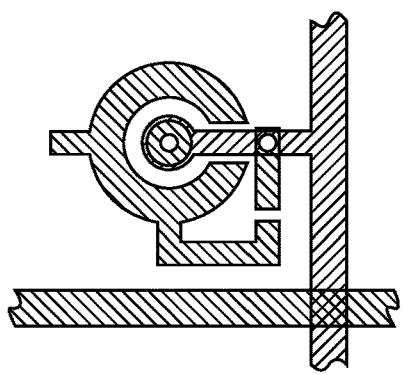
Figure 10C:
Figure 10D:
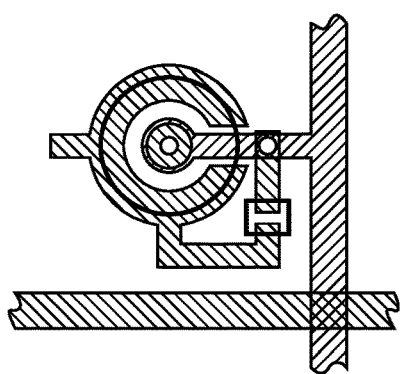
Figure 10D:
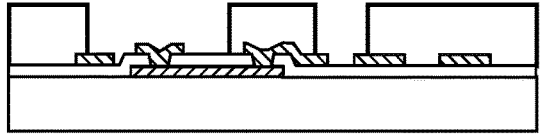

FIGS. 10A through 10D depict associated plan and partial cross-section view of steps in the fabrication of the subpixel of FIG. 6C. On a suitable substrate 1000, such as glass or polyimide, the TFT control structure is fabricated first using low temperature polysilicon or IGZO processes, and the transistors are covered with an insulator. Following the TFT fabrication a first metal layer 1002 of aluminum or copper is deposited and patterned to form column lines that will be connected through a control TFT to $V_{SS}$ (FIG. 10A). A suitable dielectric 1004 such as $SiO_2$ or a polyimide is deposited and appropriate contacts are opened to form connections between first and second metal layers (FIG. 10B). Then a second metal interconnect layer is deposited and patterned to connect rows (FIG. 10C). This is the layer that will form the electrical connections with the microLED layers so it is important to choose electrodes on the substrate and microLEDs that can form a low temperature solder bond. It is commonly the case that the substrate electrode is copper, gold, or a solder material such as a tin alloy, and the microLED electrode is a solder. In this case the second metal electrode is connected to the source of the drive transistor to drive the microLED anode, which is the center contact. The final step is to deposit and pattern a dielectric layer that will act as a trap site to capture microLEDs in fluidic assembly, and at the same time the window (access opening) over the repair site is opened to provide access to the electrodes for the printed conductor (FIG. 10D). The window over the repair site acts as a bank structure to confine the conductive ink while it dries and is annealed, so it must be large enough for the ink jet printer drop size. On the other hand, the window must be smaller than the microLED to prevent capture of microLEDs during fluidic assembly.

Figure 11A:
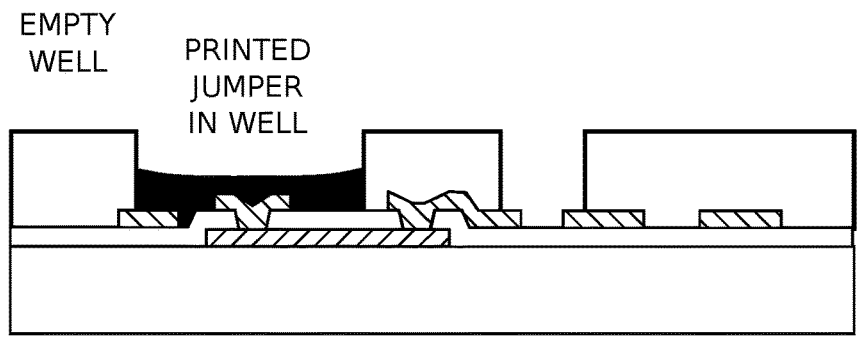
FIGS. 11A through 11E are partial cross-sectional views depicting some of the potential causes of an open circuit defect.
Figure 11B:
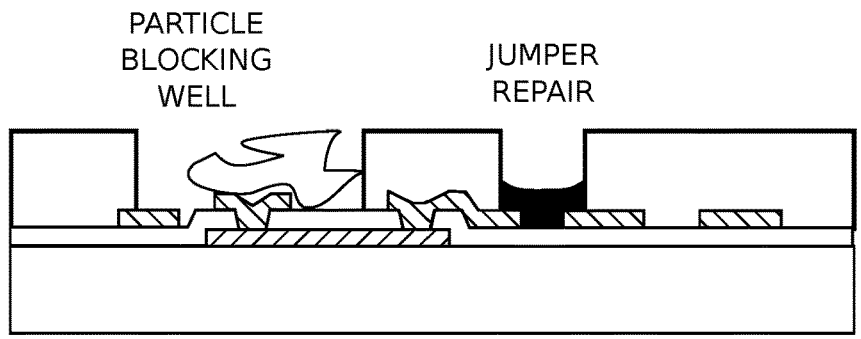
Figure 11C:
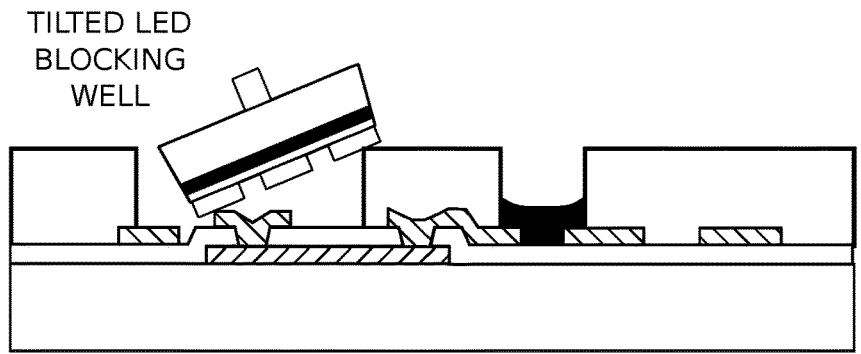
Figure 11D:
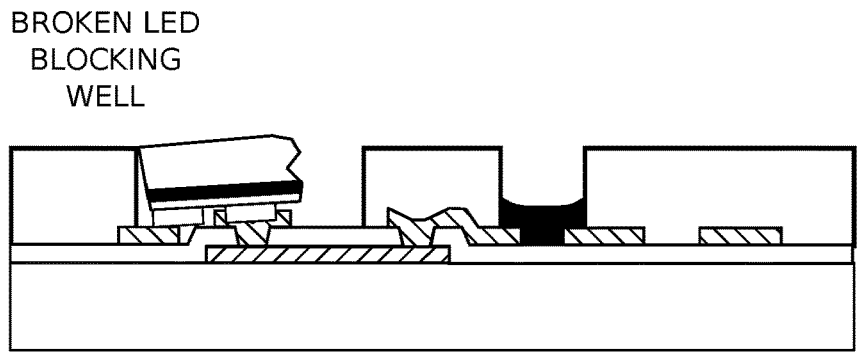
Figure 11E:
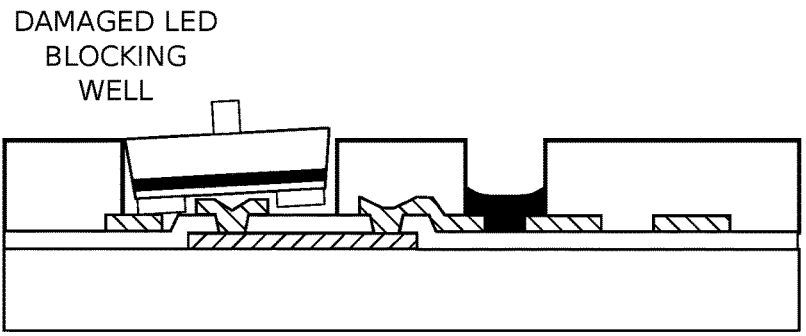

FIGS. 11A through 11E are partial cross-sectional views depicting some of the potential causes of an open circuit defect. The most common defect is an open well where the fluidic assembly process has failed to assemble a microLED in a given site. In this case it is possible to repair the open circuit by printing conductive material in the well structure to connect the cathode and anode electrodes as shown in FIG. 11A. However, it is often better to adopt a standard repair for all open defects using the repair structures, so the amount of printed conductor is the same for all repairs. Other defects such as particles (FIG. 11B), tilted microLEDs (FIG. 11C), broken microLEDs (FIG. 11D), or microLEDs with process defects such as missing electrodes (FIG. 11E), all require a separate repair site as shown.

Figure 12A:
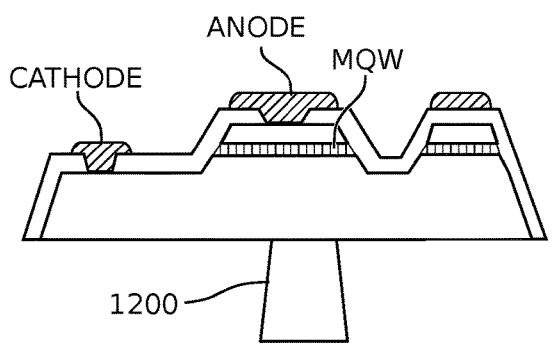
FIGS. 12A and 12B are partial cross-sectional views, respectively, of surface mount and vertical LEDs.
Figure 12B:
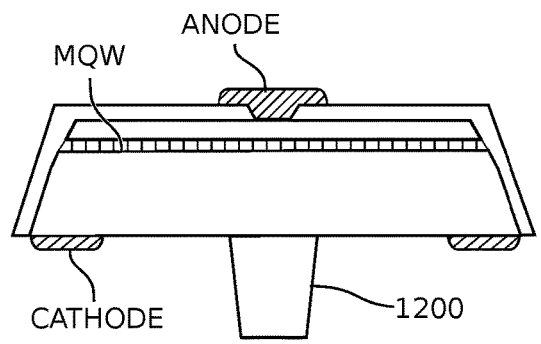

FIGS. 12A and 12B are partial cross-sectional views, respectively, of surface mount and vertical LEDs. MicroLEDs can be fabricated with two different architectures depending on the disposition of contacts to the anode and cathode. MicroLEDs with both contacts on one surface as described are called surface mount LEDs. This architecture has been described in U.S. Pat. No. 9,825,202, and in more detail in Ser. No. 16/406,080. It is also possible to fabricate microLEDs with the cathode connection on the top surface of the LED and the anode connection on the bottom surface, as shown for example in FIG. 5C or 6D. The devices are typically 10 to 150 μm in diameter, by 3 to 7 μm thick for both architectures. In some aspects the devices include a keel or post 1200, which is useful in fluidic deposition.

For vertical microLEDs the fabrication sequence is modified to form metal interconnects that make one connection to the LED after the microLED is assembled. For the examples shown, the top connection is to the cathode, but it is also possible to assemble microLEDs such that the anode connection is formed last. Both repair structures described for surface mount microLEDs can be used with vertical microLEDs by using the appropriate circuit modifications.

Two parallel-connected microLEDs may include a fuse structure to repair shorting defects. The fuse can also be formed in the lower (column) electrode if an appropriate window is opened in the well layer for either surface mount (FIG. 4A) or vertical (FIG. 5A) microLEDs. For vertical microLEDs, the fuse can also be formed on the dielectric top surface (FIG. 5D).

In the case of series-connected vertical microLEDs, shunting repair nodes are available to repair an open circuit defect, as shown in FIG. 6C for example. It is also possible with the vertical microLED to form a shunting repair node connection to the top electrode (e.g., FIG. 6E), which avoids the opening in the well layer that can interfere with fluidic assembly, but the bank effect is lost so the area covered by the conductive ink may be larger and less well controlled.

Figure 13A:
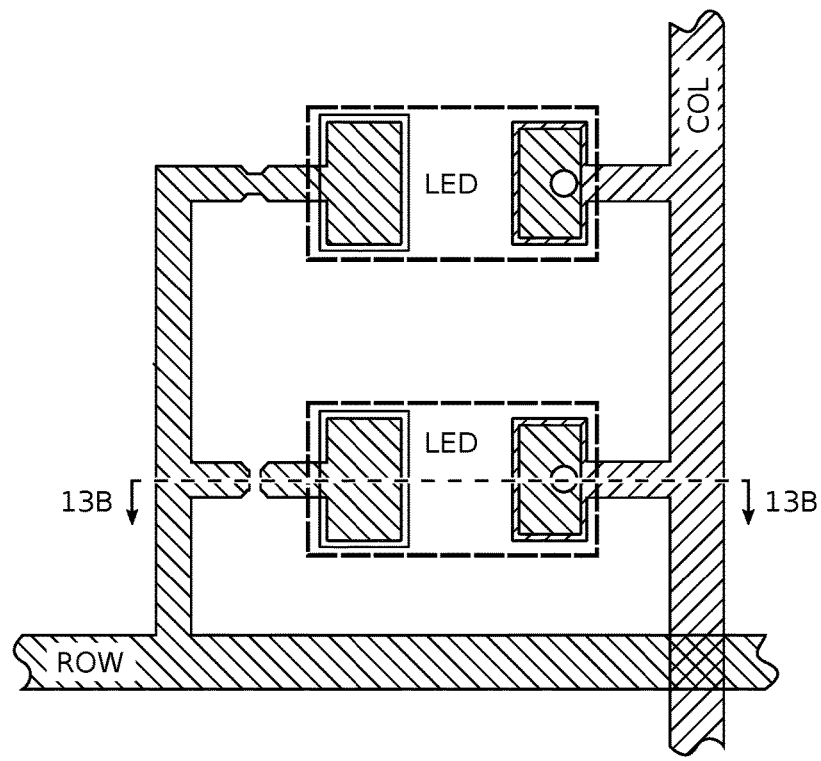
FIGS. 13A and 13B are, respectively, plan and partial cross-sectional views of a parallel repair interface suitable for surface mount LED pick-and-place or mass transfer deposition methods.
Figure 13B:
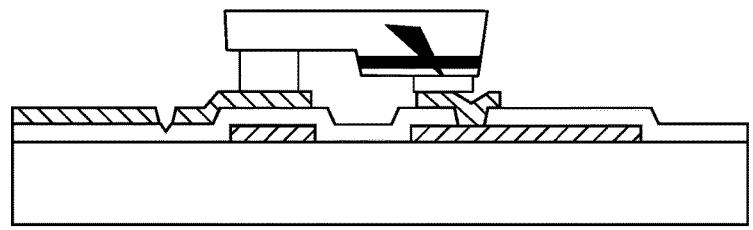

FIGS. 13A and 13B are, respectively, plan and partial cross-sectional views of a parallel repair interface suitable for surface mount LED pick-and-place or mass transfer deposition methods.

Figure 14:
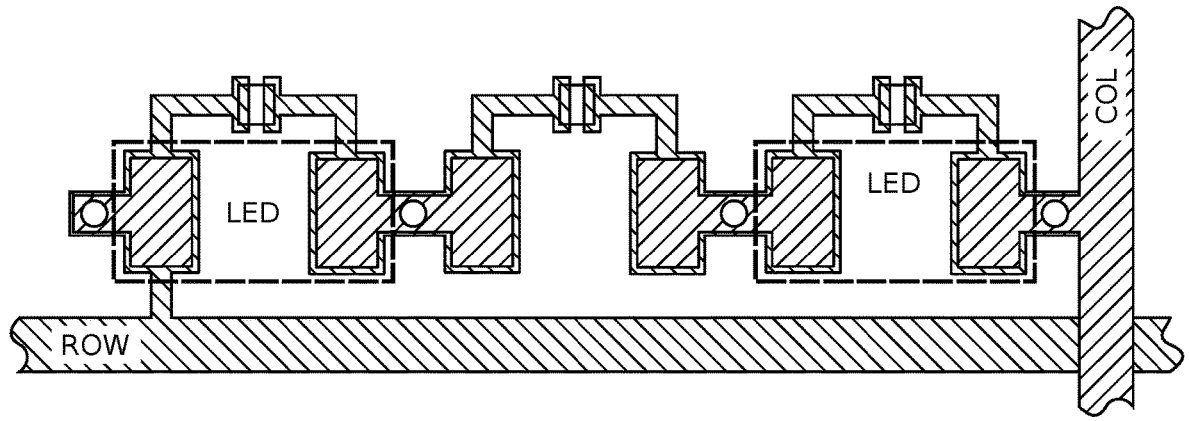
FIG. 14 is a plan view of a series repair interface suitable for surface mount pick-and-place or mass transfer deposition methods.

FIG. 14 is a plan view of a series repair interface suitable for surface mount pick-and-place or mass transfer deposition methods.

Figure 15:
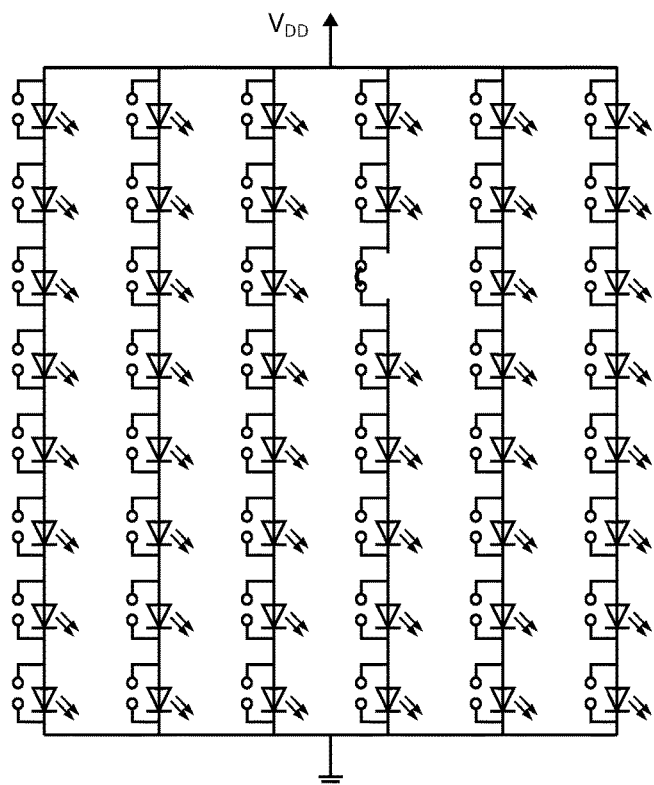
FIG. 15 is a schematic diagram of an open circuit repair structure that can be used to repair open circuits in a local dimming backlight unit (BLU).

FIG. 15 is a schematic diagram of an open circuit repair structure that can be used to repair open circuits in a local dimming backlight unit (BLU). A local dimming backlight is used with an LCD display to produce a high dynamic range (HDR) display with improved contrast. The system uses a lower resolution copy of the display image to drive the backlight, so each zone has an appropriate illumination for the image being displayed. For that system it is common to use a substrate without TFTs, relying on external drive chips to control the current supplied to each zone. In this case there is no voltage drop across the TFT and the number of microLEDs in series is chosen to match the $V_{DD}$ supplied by driver chips. Based on the number of zones in the BLU and the brightness required there are several series strings connected in parallel. There are many possible combinations depending on product requirements so a representative example is shown to illustrate the situation. The local dimming zone shown in FIG. 15 has 6 series strings each consisting of 8 microLEDs to operate at a $V_{DD}$ of 24 V, which are connected in parallel to make one zone. It can be seen that the series string operates if a microLED is shorted losing only one small area of illumination. Because the BLU has diffusers and brightness enhancing films to redistribute the light, one dark microLED does not cause a problem for the display image. On the other hand, an open site causes a full column to be dark, which creates an unacceptable dark line in the display image. Thus, the shunt repair circuit can also be used to repair open circuit defects in microLED based local dimming backlights. In the terminology presented above, each string of series-connected microLEDs may be considered a display subpixel.

Figure 16:
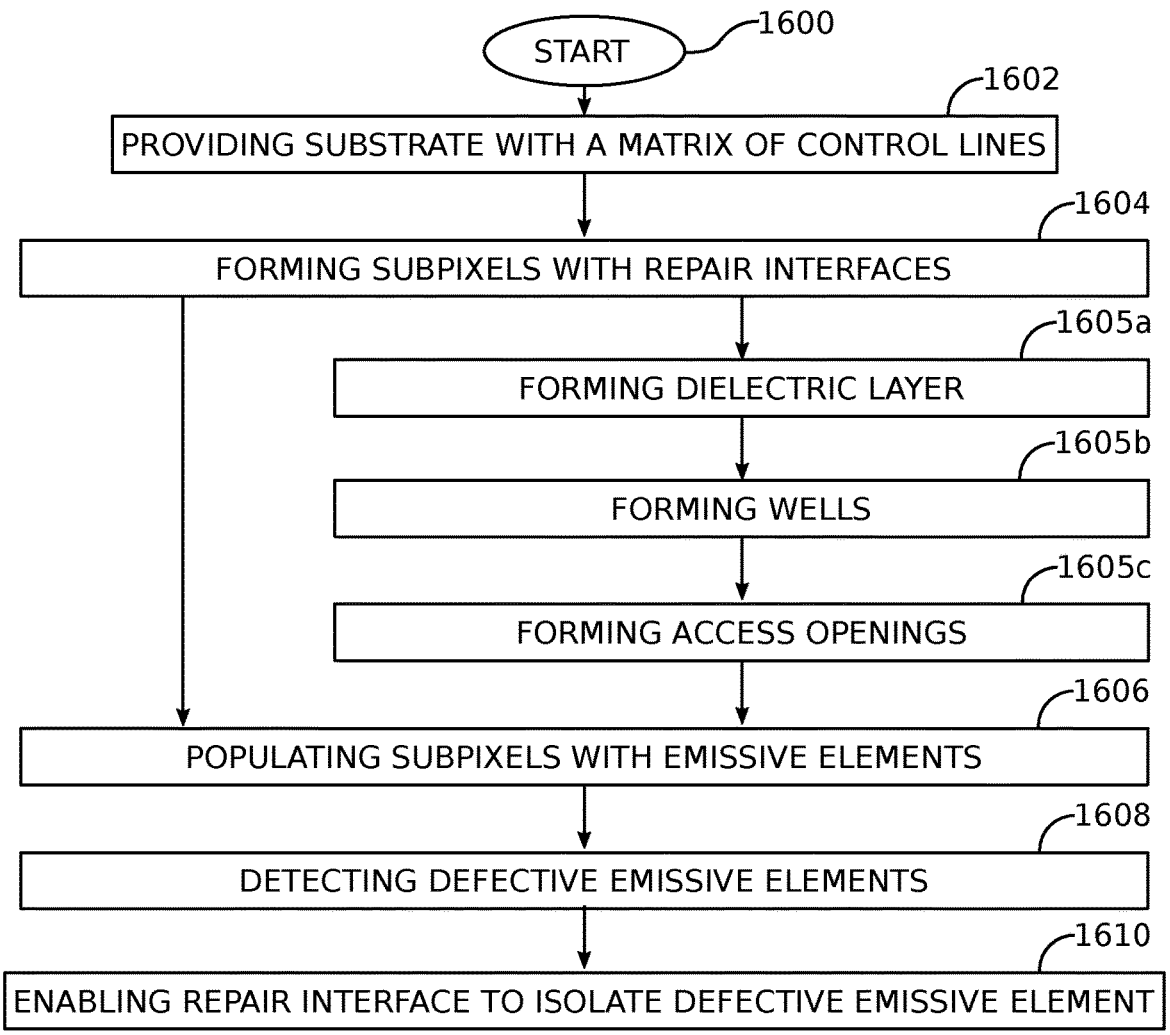
FIG. 16 is a flowchart illustrating a method for repairing an emissive element display.

FIG. 16 is a flowchart illustrating a method for repairing an emissive element display. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1600.

Step 1602 provides a substrate with a matrix of emissive element control lines. Step 1604 forms an array of emissive element subpixels, with repair interfaces, electrically connected to the matrix of control lines. Step 1606 populates the subpixels with emissive elements. Step 1608 detects a defective emissive element in a first subpixel, and Step 1610 enables a first subpixel repair interface to isolate the defective emissive element.

In one aspect, prior to populating the subpixels with emissive elements in Step 1606, Step 1605*a* forms a dielectric layer overlying a top surface of the substrate. Step 1605*b* forms wells in the dielectric layer, with each well configured to accept an emissive element. Step 1605*c* forms access openings in the dielectric layer exposing each repair interface.

Forming the array of emissive element subpixels with repair interfaces in Step 1604 includes either forming a parallel repair interface with n number of selectively fusible electrically conductive repair nodes, connected in parallel to a control line of the matrix, or a series repair interface with m number of repair nodes, selectively connectable to bypass adjacent series-connected emissive elements.

For example, if Step 1606 populates subpixels with n emissive elements electrically connected in parallel between a first control line and a second control line of the matrix, and Step 1608 detects a low impedance defective emissive element or an element creating a short circuit, then Step 1610 enables a parallel repair interface to fuse open an electrical connection between the defective emissive element and a matrix control line.

If Step 1604 configures subpixels for the series connection of m emissive elements between a first control line and a second control line of the matrix, and Step 1608 detects a defective emissive element such as a high impedance defective emissive element (a non-functioning or a missing emissive element), then Step 1610 enables a series repair interface to form an electrical connection bypassing the defective emissive element.

Emissive element display subpixel repair and redundancy interfaces have been provided at the subpixel level. Examples of particular circuit layouts, geometries, and explicit process steps have been presented to illustrate the invention. However, the invention is not limited to merely these examples. Other variations and embodiments of the invention will occur to those skilled in the art.

We claim:

1. A display with emissive element repair interfaces, the display comprising:
   a substrate with a top surface;
   a matrix of electrically conductive control lines;
   an array of emissive element pixels, each pixel comprising a plurality of subpixels;
   each subpixel configured to accept a plurality of serially connected emissive elements, and selectively engageable in response to signals on the control lines; and,
   each subpixel comprising a plurality of repair nodes, each repair node selectively connectable to bypass a corresponding emissive element.

2. The display of claim 1 wherein each repair node comprises a first pad interface connected to a first contact of a corresponding emissive element, a second pad interface connected to a second contact of the corresponding emissive element, and wherein the first and second pad interfaces are configured to be selectively connectable with a conductive link.

3. The display of claim 2 further comprising:
   a dielectric layer overlying the substrate top surface; and,
   wells in the dielectric layer, each well formed to accept an emissive element.

4. The display of claim 3 further comprising:
   access openings in the dielectric layer exposing each repair node.

5. The display of claim 2 wherein each subpixel comprises a first emissive element with a first contact connected to a first control line, and an nth emissive element with a second contact connected to a second control line.

6. The display of claim 2 wherein the emissive elements and repair node pad interfaces are formed on the substrate top surface.

7. The display of claim 6 further comprising:
a dielectric layer overlying the substrate top surface; and,
wells in the dielectric layer, each well formed to accept an emissive element.

8. The display of claim 2 further comprising:
a dielectric layer overlying the substrate top surface;
wells in the dielectric layer, each well formed to accept an emissive element; and,
wherein the repair node pad interfaces are formed on the dielectric layer top surface.

9. The display of claim 2 wherein a first subpixel includes a high impedance defective first emissive element, where a high impedance defective emissive element is selected from the group consisting of an emissive element creating an electrical open circuit or a missing emissive element; and,
wherein a first repair node pad interfaces associated with the defective first emissive element are electrically connected to bypass the defective first emissive element.

10. The display of claim 2 wherein each subpixel is configured to accept n number of serially connected emissive elements and n number of repair nodes; and, wherein the first contact of the first emissive element is selectively connectable to each contact of every emissive element in the subpixel through the repair nodes.

11. The display of claim 1 further comprising:
emissive elements populating the subpixels.

12. The display of claim 11 wherein the emissive elements are selected from the group consisting of surface mount emissive elements and vertical emissive elements.

13. A method for repairing an emissive element display, the method comprising:
providing a substrate with a matrix of emissive element control lines;
forming an array of subpixels, with contacts for serially connected emissive elements and repair nodes, electrically connected to the matrix of control lines;
populating the subpixels with emissive elements;
detecting a high impedance defective emissive element in a first subpixel; and
enabling a first subpixel repair node to bypass the defective emissive element.

14. The method of claim 13 wherein forming the array of emissive element subpixels with repair nodes includes forming each repair node with a first pad interface connected to a first contact of a corresponding emissive element, a second pad interface connected to a second contact of the corresponding emissive element; and,
wherein enabling the first repair node includes electrically connecting the first and second pad interfaces of the first repair node with a conductive link.

15. The method of claim 14 further comprising:
prior to populating the subpixels with emissive elements, forming a dielectric layer overlying a top surface of the substrate; and,
forming wells in the dielectric layer, each well configured to accept an emissive element.

16. The method of claim 15 further comprising:
forming access openings in the dielectric layer exposing each repair node.

17. The method of claim 15 wherein forming the array of subpixels includes forming the emissive elements and repair node pad interfaces on the substrate top surface.

18. The method of claim 15 wherein forming the array of subpixels includes forming the repair node pad interfaces on the dielectric top surface.

19. The method of claim 14 wherein forming the array of subpixels includes forming the emissive elements and repair node pad interfaces on the substrate top surface.

20. A display backlight with emissive element repair interfaces, the backlight comprising:
a substrate with a top surface;
a matrix of electrically conductive control lines;
an array of emissive element pixels, each pixel comprising a plurality of subpixels;
each subpixel configured to accept a plurality of serially connected emissive element strings, each string connected in parallel, and wherein each subpixel is selectively engageable in response to signals on the control lines; and,
each subpixel comprising a plurality of repair nodes, each repair node selectively connectable to bypass a corresponding emissive element.

21. The backlight of claim 20 wherein at least one serially connected emissive element string includes a laser fusible link connecting the second contact of a first emissive element to the first contact of an adjacent serially connected second emissive element.

* * * * *